United States Patent
Fukuda et al.

(10) Patent No.: US 7,482,685 B2
(45) Date of Patent: Jan. 27, 2009

(54) CERAMIC CIRCUIT BOARD, METHOD FOR MAKING THE SAME, AND POWER MODULE

(75) Inventors: Yoshiyuki Fukuda, Ayase (JP); Hiromasa Kato, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 10/572,961

(22) PCT Filed: Sep. 27, 2004

(86) PCT No.: PCT/JP2004/014528

§ 371 (c)(1),
(2), (4) Date: Jan. 22, 2007

(87) PCT Pub. No.: WO2005/032225

PCT Pub. Date: Apr. 7, 2005

(65) Prior Publication Data

US 2007/0160858 A1    Jul. 12, 2007

(30) Foreign Application Priority Data

Sep. 25, 2003    (JP)    ............... 2003-334190

(51) Int. Cl.
*H01L 23/15*    (2006.01)
*H01L 23/06*    (2006.01)
*H01L 23/10*    (2006.01)

(52) U.S. Cl. .............. 257/703; 257/E23.009; 257/712; 257/706; 257/750; 428/469; 428/698; 228/121

(58) Field of Classification Search .......... 257/E23.188, 257/E23.009, 712, 703, 706, 750, 700; 428/469, 428/698, 209, 210; 361/704; 228/121
See application file for complete search history.

(56) References Cited

U.S. PATENT DOCUMENTS

| 3,893,224 A | 7/1975 | Besson ................. 228/124 |
| 5,130,498 A * | 7/1992 | Yoshida et al. ............. 174/252 |

(Continued)

FOREIGN PATENT DOCUMENTS

JP    61-291942    12/1986

(Continued)

*Primary Examiner*—Chris C. Chu
(74) *Attorney, Agent, or Firm*—Oblon, Spivak, McClelland, Maier & Neustadt, P.C.

(57) ABSTRACT

In a ceramic circuit board 1 prepared by integrally joining a circuit layer 4 composed of a clad member including a circuit plate 2 made of an Al plate and an Al—Si brazing material layer 3 to a ceramic substrate 6, a surface of the clad member adjacent to the Al—Si brazing material layer 3 is joined to the ceramic substrate 6 with an Al alloy film 5 therebetween, the Al alloy film 5 having a thickness of less than 1 μm and being provided on the surface of the ceramic substrate 6. According to this structure, a ceramic circuit board in which the generation of voids in the joint interface can be effectively suppressed, the joint strength of the metal member serving as the circuit layer can be increased, and the heat resistance cycle characteristics can be drastically improved, and a method for producing the same can be provided.

13 Claims, 1 Drawing Sheet

U.S. PATENT DOCUMENTS

| | | | |
|---|---|---|---|
| 5,213,877 A * | 5/1993 | Yoshida et al. | 428/209 |
| 5,621,243 A * | 4/1997 | Baba et al. | 257/712 |
| 5,675,474 A * | 10/1997 | Nagase et al. | 361/704 |
| 6,033,787 A * | 3/2000 | Nagase et al. | 428/545 |
| 6,261,703 B1 * | 7/2001 | Sasaki et al. | 428/627 |
| 6,426,154 B1 * | 7/2002 | Naba et al. | 428/620 |
| 6,483,185 B1 * | 11/2002 | Nagase et al. | 257/706 |
| 6,686,030 B2 * | 2/2004 | Tsukaguchi et al. | 428/210 |

FOREIGN PATENT DOCUMENTS

| | | | |
|---|---|---|---|
| JP | 5-166968 | | 7/1993 |
| JP | 9-59074 | | 3/1997 |
| JP | 9-110547 | | 4/1997 |
| JP | 10-65296 | | 3/1998 |
| JP | 2001-144234 | | 5/2001 |
| JP | 2002-111211 | | 4/2002 |
| JP | 2003086744 A | * | 3/2003 |

* cited by examiner

CERAMIC CIRCUIT BOARD, METHOD FOR MAKING THE SAME, AND POWER MODULE

TECHNICAL FIELD

The present invention relates to a ceramic circuit board, which is a joined body (bonded body) of a ceramic member and a metal circuit layer, a method for producing the same, and a power module including the ceramic circuit board. In particular, the present invention relates to a ceramic circuit board in which the generation of voids in the joint interface can be effectively suppressed, the joint strength (bonding strength) of the metal member serving as the circuit layer can be increased, and the heat resistance cycle characteristics can be drastically improved, a method for producing the same, and a power module.

BACKGROUND ART

Hitherto, as a method for joining (bonding) a ceramic member and a metal circuit member, a simultaneous sintering method (co-fire method) of printing paste of a high melting point metal (refractory metal) such as Mo or W on the surface of a ceramic sheet-shaped molding and then sintering, a DBC method (direct bonding copper method) in which a circuit layer is integrally joined on the surface of a ceramic substrate using a eutectic reaction between copper serving as a circuit material and oxygen, an active metal brazing method using a brazing material containing an active metal such as Ti as a joining material of a metal circuit layer, and the like have been widely used.

Joined bodies of a ceramic member and a metal member produced by the above-described joining methods are used in various fields. A typical example thereof is a ceramic circuit board for mounting and joining a semiconductor device and the like. Examples of characteristics required for such a ceramic circuit board include satisfactory heat dissipation effect (heat radiating property), high structural strength as a whole ceramic circuit board, high joint strength (bonding strength) between a ceramic substrate and a metal circuit plate, and satisfactory heat resistance cycle characteristics as a circuit board.

As a ceramic substrate constituting the ceramic circuit board, a sintered body of aluminum nitride (AlN), aluminum oxide ($Al_2O_3$), or silicon nitride ($Si_3N_4$) has been widely used.

For example, an aluminum nitride substrate is particularly excellent in heat dissipation effect because it has a high thermal conductivity of 160 W/m·K or more, which is higher than that of other ceramic substrates. A silicon nitride substrate has a three-point bending strength (at room temperature) of 600 MPa or more, and thus the strength of the circuit board can be improved when silicon nitride is used as a material for a ceramic substrate. In contrast, an aluminum oxide substrate has a thermal conductivity of about 20 W/m·K and a three-point bending strength of about 360 MPa. Therefore, in particular, in order to achieve high heat dissipation effect and high structural strength, use of a nitride ceramic substrate is more preferable for a circuit board, compared with an oxide ceramic substrate.

In view of the joint strength between a ceramic substrate and a metal circuit plate, among the above-described joining methods, the active metal brazing method is preferred. In the active metal brazing method, a metal foil containing at least one active metal such as Ti, Hf, Zr, and Nb or paste prepared by adding these active metals to an Ag—Cu brazing material is applied between the ceramic substrate and the metal circuit plate, and both members are then integrally joined and bonded by heat treatment. When a joining by the active metal brazing method is performed using a nitride ceramic substrate, a joint layer composed of a nitride of the above active metal is formed after the heat treatment, resulting in the formation of a stronger joint state. Thus, a joined body of a nitride ceramic and a metal member prepared by the active metal brazing method satisfies the characteristics required for a circuit board. Accordingly, such a joined body has been widely used as a substrate for electronic circuits, such as a substrate for a semiconductor module (power module) on which a power semiconductor device is mounted.

In addition, as a known insulating circuit board for mounting a semiconductor, the following circuit board has also been proposed: The circuit board has a structure in which, for example, a metal circuit layer is laminated and bonded on at least one of the surfaces of a ceramic substrate with an Al—Si— or Al—Ge-based brazing material for the metal layer therebetween. By adjusting the Vickers hardness and the thickness of the metal layer and the thickness and the flexural strength of the ceramic substrate to predetermined values, the heat resistance cycle life of the circuit board is extended (see, for example, Patent Document 1).

Furthermore, as a known ceramics wiring board, a wiring board prepared by forming a metal layer such as an Al or Ni layer that has excellent wettability with a brazing material and that has a thickness of 1 to 10 µm on the surface of a ceramic substrate has also been proposed (see, for example, Patent Document 2).

[Patent Document 1] Japanese Unexamined Patent Application Publication No. 2001-144234

[Patent Document 2] Japanese Unexamined Patent Application Publication No. 2002-111211

However, in the above known circuit boards, although the structural strength is improved to some degree, the heat resistance cycle characteristics do not necessarily satisfy the present technical requirement. The reason for this is as follows: As the capacity, the output, and the integration degree of recent semiconductor devices increase, the heat generating amount from the devices tends to increase. When the heating value increases, cracks due to the difference in thermal expansion between the metal circuit plate and the ceramic substrate are easily generated in the ceramic substrate and the brazing material layer, resulting in problems such as a decrease in the withstand voltage of the ceramic substrate and separation of the metal circuit layer. In particular, when the metal circuit layer is joined by the active metal brazing method, a phase of a nitride of the active metal is formed on the surface adjacent to the nitride ceramic. Although this active metal nitride phase effectively acts on the improvement of the joint strength, the phase does not have a function for releasing a stress generated by the difference in thermal expansion. Consequently, cracks are easily generated in the ceramic substrate, resulting in the problem of degrading the durability of the circuit board.

In order to solve the above-described problem, a method is also employed in which, instead of the copper plate serving as the circuit layer, an aluminum plate is used and is joined with a ceramic substrate with an Al alloy brazing material therebetween. The aluminum has not only a conductivity next to that of copper and high heat dissipation effect but also a property that plastic deformation is easily caused by a thermal stress. Therefore, the generation of cracks in the ceramic substrate, solder, and the like can be prevented.

On the other hand, an Al—Si alloy forms a joint by bonding to oxygen that is present on the surface of the ceramic substrate. However, unlike a substrate made of an oxide ceramic represented by alumina, particularly in a substrate made of a nitride ceramic such as aluminum nitride or silicon nitride, since the oxygen content per unit area of the substrate structure is low, the bondability (i.e., wettability of the interface between the Al—Si alloy and the ceramic) is low. In order to compensate for this disadvantage, the joining is performed while a load is applied. However, because of a problem relating to the bondability with aluminum nitride, and in particular, silicon nitride, the heat resistance cycle characteristics are varied. Thus, the countermeasure is not sufficient.

As described above, in order to improve the wettability of the brazing material, a method of forming an Al metal film on the surface of a ceramic substrate and then joining the substrate is also employed. However, a phenomenon in which the surface of the structure partly rises because of the diffusion of Al elements in the Al metal film, i.e., the hillock phenomenon, occurs. Consequently, voids (air gaps) are easily formed between the Al metal film and the Al—Si brazing material, resulting in a decrease in the joint strength of the metal circuit layer. Thus, disadvantageously, the heat resistance cycle characteristics as the whole circuit board is easily degraded. Furthermore, since the Al metal film is formed so that the thickness of the film is as large as about 1 to 10 μm, the time required for vapor deposition of Al metal is increased, resulting in the problem of an increase in the production cost.

In the semiconductor field, in addition to the developments of integration degree and the increase in the operation speed of LSIs, for example, the applications of power devices such as GTO and IGBT (insulated gate bipolar transistor) have been increasing. Under this situation, the heating value (amount of heat) generated from a silicon chip (semiconductor element) has been steadily increasing. When the power modules are used in the fields requiring a long-term reliability, such as electric railroad vehicles and electric automobiles, the heat dissipation effect and the durability of a circuit board having a silicon chip thereon or a module including the circuit board therein are of more concern. Unfortunately, in the known power modules, the durability of the joined part is insufficient and satisfactory reliability cannot be ensured.

The present invention has been made in order to solve the above-mentioned problems in the related art. In particular, it is an object of the present invention to provide a ceramic circuit board in which the generation of voids in the joint interface can be effectively suppressed, the joint strength of a metal member serving as a circuit layer can be increased, and the heat resistance cycle characteristics can be drastically improved, a method for producing the same, and a power module including the circuit board.

DISCLOSURE OF INVENTION

In order to achieve the above object, the present inventors have conducted various studies of a method for effectively preventing or suppressing the diffusion of Al elements that causes the hillock phenomenon. As a result, the present inventors have found the following knowledge: In particular, instead of the conventional Al metal film, by forming an Al alloy film having a predetermined thickness on the surface of a ceramic substrate, even when the thickness of the Al alloy film is small less than 1 μm, the hillock phenomenon can be satisfactorily suppressed, the generation of voids in the joint surface can be effectively prevented, and the joint assembly of the circuit board can be simplified to reduce the production cost drastically. This finding and knowledge resulted in completion of the present invention.

Namely, according to a ceramic circuit board of the present invention, in a ceramic circuit board prepared by integrally joining a circuit layer composed of a clad member including an Al plate and an Al—Si brazing material to a ceramic substrate, a surface of the clad member adjacent to the Al—Si brazing material is joined to the ceramic substrate with an Al alloy film therebetween, the Al alloy film having a thickness of less than 1 μm and being provided on the surface of the ceramic substrate.

In the present invention, the circuit layer is composed of a clad member including an Al plate and an Al—Si brazing material. In view of the current-carrying capacity, the thickness of the circuit layer is preferably set to the range of 0.15 to 0.5 mm.

In the ceramic circuit board, the ceramic substrate is preferably composed of an aluminum nitride sintered body or a silicon nitride sintered body.

The ceramic substrate constituting the ceramic circuit board of the present invention is not particularly limited as long as the ceramic substrate has a predetermined heat dissipation effect and structural strength. Substrates composed of a sintered body of a nitride ceramic such as aluminum nitride, silicon nitride, or sialon (Si—Al—O—N); a sintered body of a carbide ceramic such as silicon carbide (SiC); and a sintered body of an oxide ceramic such as aluminum oxide ($Al_2O_3$) or zirconia ($ZrO_2$) can be suitably used. However, high effect of improving the bondability (bonding property) can be achieved even in the nitride ceramic substrates, which have a low oxygen concentration on the surface of the substrate structure. Accordingly, when the ceramic substrate is an aluminum nitride substrate or a silicon nitride substrate, particularly excellent operation and effect can be obtained.

The Al alloy film disposed on the surface of the ceramic substrate improves the wettability of the Al—Si brazing material and increases the joint strength of the clad member serving as the circuit layer bonded to the ceramic substrate. The Al alloy film is formed by sputtering method, vapor deposition method, or the like. Furthermore, according to such an Al alloy film, the diffusion and the migration of Al elements do not occur during joining by heating, and voids due to the Al diffusion are not generated. The thickness of the Al alloy film is less than 1 μm. When the thickness of the Al alloy film is excessively small to be less than 0.1 μm, the above improvement effect of the wettability is not sufficient. On the other hand, when the Al alloy film is formed so as to have a thickness of 1 μm or more, the above effect is saturated and it takes a long time to form the Al alloy film, resulting in a decrease in production efficiency. Accordingly, the thickness of the Al alloy film is set to less than 1 μm, but is more preferably set to the range of 0.1 to 0.5 μm.

In the above ceramic circuit board, the Al alloy film preferably contains at least one rare earth element selected from Y, Sc, La, Ce, Nd, Sm, Gd, Tb, Dy, Er, Th, and Sr in an amount of 1 to 5 atomic percent. When the Al alloy film is formed using an alloy containing the predetermined rare earth element in the predetermined content, in particular, the wettability of the brazing material can be adjusted more appropriately, the loss by flowing of the brazing material due to the excessive increase in the wettability can be prevented, the joint strength of the circuit layer can be further increased, and the generation of voids in the joint surface can be effectively prevented.

Furthermore, in the above ceramic circuit board, the Al content of the Al—Si brazing material is preferably 85 mass percent or more and the Si content thereof is preferably in the range of 6 to 15 mass percent. When the Al content and the Si content of the Al—Si brazing material are in the above ranges, the brazing material has a melting point lower than that of Al by 50° C. to 100° C. Consequently, the joining of an Al—Si alloy layer serving as the circuit layer is simply performed and the joining with the Al—Si brazing material is also easily performed.

According to a method for producing the above-described ceramic circuit board of the present invention, in a method for producing a ceramic circuit board prepared by integrally joining a circuit layer composed of a clad member including an Al plate and an Al—Si brazing material to an Al alloy film, the circuit layer composed of the clad member including the Al plate and the Al—Si brazing material and a ceramic substrate having the Al alloy film thereon overlap with each other, and the circuit layer and the ceramic substrate are then joined by heating at a temperature of 580° C. to 630° C. in an atmosphere of a degree of vacuum of $10^{-2}$ Pa or lower while a pressing load is applied so that the pressure is 0.2 MPa or more.

In the above production method, when the pressure during joining is less than 0.2 MPa, the adhesiveness between the circuit layer composed of the clad member and the ceramic substrate becomes insufficient. Furthermore, in an atmosphere where the degree of vacuum is in the above range, oxidation of Al—Si proceeds and the wettability is increased to improve the bondability. Furthermore, by heating in the above joint temperature range (580° C. to 630° C.), the circuit layer composed of the clad member can be integrally joined to the ceramic substrate having an Al alloy film thereon in a short period of time.

A power module according to the present invention includes a ceramic circuit board prepared by integrally joining a circuit layer composed of a clad member including an Al plate and an Al—Si brazing material to a ceramic substrate, wherein a surface of the clad member adjacent to the Al—Si brazing material is joined to the ceramic substrate with an Al alloy film therebetween, the Al alloy film having a thickness of less than 1 μm and being provided on the surface of the ceramic substrate; a semiconductor element mounted on the circuit layer; and a heat sink that dissipates heat generated from the semiconductor element via the ceramic circuit board.

BEST MODE FOR CARRYING OUT THE INVENTION

Embodiments of a ceramic circuit board of the present invention will now be described specifically with reference to the attached drawings.

EXAMPLES 1 to 116 AND COMPARATIVE EXAMPLES 1 to 45

As shown in Tables 1 to 6, as ceramic substrates used in examples and comparative examples, a large number of silicon nitride ($Si_3N_4$) substrates, aluminum nitride (AlN) substrates, sialon (Si—Al—O—N) substrates, silicon carbide (SiC) substrates, and aluminum oxide ($Al_2O_3$) substrates that have a thickness of 0.625 to 1.2 mm were prepared. A blasting process and a polishing process were performed on a surface of each ceramic substrate for joining a clad member serving as a circuit layer so that the surface roughness (Ra) was controlled to be 1 μm.

Subsequently, an Al alloy film having the composition and the thickness that were shown in Tables 1 to 6 was formed by vapor deposition on a part of each ceramic substrate for joining the circuit layer, the ceramic substrate having an adjusted surface roughness.

On the other hand, an Al circuit plate and an Al—Si brazing material that had the compositions shown in Tables 1 to 6 were integrally joined so as to have a thickness ratio of 75:25 by rolling operation. Thus, clad members serving as the circuit layer were prepared. The thicknesses of the resulting clad members were determined to the values shown in Tables 1 to 6.

Subsequently, each of the circuit layers composed of the clad member including the Al plate serving as the circuit plate and the Al—Si brazing material and each of the ceramic substrates having an Al alloy film (Examples) or an Al metal film (Comparative Example 1) thereon, which were prepared as described above, overlapped with each other. Each of the circuit layers and each of the ceramic substrates were then joined by heating to a temperature shown in Tables 1 to 6 in an atmosphere of a degree of vacuum shown in Tables 1 to 6 while a pressing load was applied so that the pressure was a value shown in Tables 1 to 6. Thereby, ceramic circuit boards of the examples and the comparative examples were produced.

Figure 1:
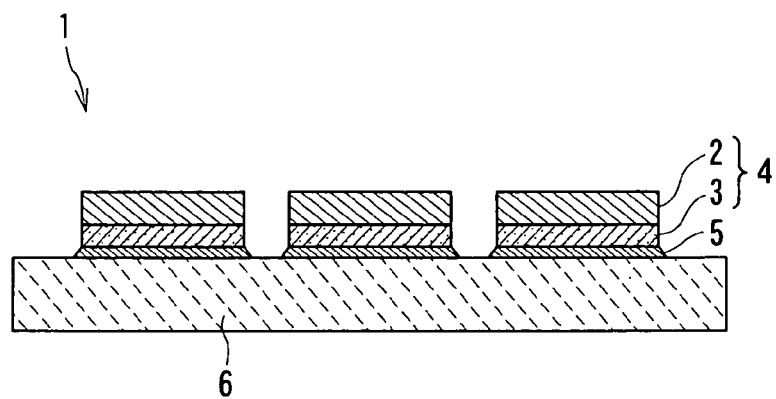
FIG. 1 is a cross-sectional view showing the structure of a ceramic circuit board according to an embodiment of the present invention.

As shown in FIG. 1, a ceramic circuit board 1 produced as described above has a structure in which a circuit layer 4 composed of a clad member including a circuit plate 2 made of an Al plate and an Al—Si brazing material layer 3 is integrally joined on the surface of a ceramic substrate 6 having an Al alloy film 5 (Examples) or an Al metal film (Comparative Example 1) thereon.

In order to evaluate the characteristics of the ceramic circuit boards of the examples and the comparative examples produced as described above, the following measurement tests were performed. First, a void ratio on the joint surface disposed under the circuit layer of each ceramic circuit board was measured with an ultrasonic flaw detector. The void ratio was determined by analyzing an image of voids that are present on the joint surface of a 20 mm square, the image being taken by the ultrasonic flaw detector. The void ratio was measured as a void area ratio per 20 mm square of the jointed area.

A joint strength was measured as follows: The circuit layer 4 of the ceramic circuit board 1 of each example and each comparative example was pulled upward in the vertical direction in FIG. 1. The value calculated by dividing the tensile load when the circuit layer 4 was peeled and separated from the ceramic substrate 6 by the jointed area was defined as the joint strength. Tables 1 to 6 show the measured values, the specifications of the ceramic circuit boards, the joining conditions, and the like.

TABLE 1

| | | STRUCTURE OF CLAD MEMBER (CIRCUIT LAYER) | | | AL ALLOY FILM ON SURFACE OF CERAMIC SUBSTRATE | | JOINING TREATMENT | | | | VOID |
|---|---|---|---|---|---|---|---|---|---|---|---|
| SAMPLE No. | KIND OF CERAMIC SUBSTRATE | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (μm) | PRESSING LOAD (MPa) | DEGREE OF VACUUM (Pa) | TEMPER-ATURE (°C.) | JOINING STRENGTH (N/20 mm) | AREA RATIO (%) |
| EXAMPLE 1 | Si₃N₄ | 98Al | 15Si—Al | 0.2 | 5Y—Al | 0.5 | 0.2 | 10⁻² | 600 | 45 | 9 |
| EXAMPLE 2 | Si₃N₄ | 97Al | 7.5Si—Al | 0.5 | 4Gd—Al | 0.1 | 1 | 10⁻² | 580 | 47.3 | 5.6 |
| EXAMPLE 3 | AlN | 98Al | 10Si—Al | 0.3 | 3Er—Al | 0.8 | 0.3 | 10⁻² | 600 | 55.8 | 2.3 |
| EXAMPLE 4 | AlN | 95Al | 10Si—Al | 0.5 | 4Y—1Ce—Al | 0.5 | 0.6 | 10⁻² | 590 | 61.9 | 0.3 |
| EXAMPLE 5 | Si—Al-0-N | 98Al | 10Si—Al | 0.3 | 4Nd—Al | 0.2 | 1 | 10⁻² | 630 | 48.2 | 7.8 |
| EXAMPLE 6 | Si—Al-0-N | 96Al | 6Si—Al | 0.15 | 5Sc—Al | 0.1 | 0.8 | 10⁻² | 620 | 46.8 | 8.9 |
| EXAMPLE 7 | SiC | 95Al | 8Si—Al | 0.3 | 3Y—1La—0.5Sr—Al | 0.3 | 0.2 | 10⁻² | 600 | 41.2 | 4.3 |
| EXAMPLE 8 | SiC | 99Al | 7.5Si—Al | 0.5 | 3Dy—1Th—Al | 0.5 | 0.5 | 10⁻² | 610 | 43.5 | 3.1 |
| EXAMPLE 9 | Al₂O₃ | 98Al | 10Si—Al | 0.3 | 3Tb—Al | 0.3 | 0.3 | 10⁻² | 610 | 63.2 | 7.5 |
| EXAMPLE 10 | Al₂O₃ | 97Al | 7.5Si—Al | 0.5 | 3Y—Al | 0.4 | 0.3 | 10⁻² | 600 | 60.4 | 2.8 |
| EXAMPLE 11 | Si₃N₄ | 99Al | 15Si—Al | 0.2 | 3Y—Al | 0.3 | 1 | 10⁻² | 620 | 58.2 | 0.7 |
| EXAMPLE 12 | Si₃N₄ | 99Al | 15Si—Al | 0.5 | 1Y—Al | 0.1 | 0.5 | 10⁻² | 600 | 50.3 | 4.5 |
| EXAMPLE 13 | Si₃N₄ | 97Al | 15Si—Al | 0.2 | 3Nd—Al | 0.8 | 0.2 | 10⁻² | 630 | 53.6 | 2.4 |
| EXAMPLE 14 | Si₃N₄ | 96Al | 12Si—Al | 0.15 | 3Er—Al | 0.5 | 1.5 | 10⁻² | 590 | 61.9 | 1.4 |
| EXAMPLE 15 | Si₃N₄ | 99Al | 12Si—Al | 0.2 | 3Y—Al | 0.1 | 1 | 10⁻² | 580 | 63.3 | 0 |
| EXAMPLE 16 | Si₃N₄ | 99Al | 12Si—Al | 0.2 | 3Y—Al | 0.8 | 2.5 | 10⁻² | 580 | 64.5 | 0 |
| EXAMPLE 17 | Si₃N₄ | 98Al | 12Si—Al | 0.2 | 4Sm—Al | 0.1 | 0.5 | 10⁻² | 580 | 53.7 | 2 |
| EXAMPLE 18 | Si₃N₄ | 98Al | 12Si—Al | 0.3 | 5Gd—Al | 0.8 | 2 | 10⁻² | 580 | 64.6 | 0 |
| EXAMPLE 19 | Si₃N₄ | 95Al | 12Si—Al | 0.5 | 4Sc—Al | 0.8 | 1 | 10⁻² | 580 | 56.3 | 0.8 |
| EXAMPLE 20 | Si₃N₄ | 99Al | 10Si—Al | 0.5 | 1Y—Al | 0.5 | 0.5 | 10⁻² | 600 | 47.8 | 5.5 |
| EXAMPLE 21 | Si₃N₄ | 98Al | 10Si—Al | 0.5 | 1Er—Al | 0.5 | 2 | 10⁻² | 605 | 59.2 | 0.2 |
| EXAMPLE 22 | Si₃N₄ | 97Al | 10Si—Al | 0.2 | 2Sr—Al | 0.3 | 1.5 | 10⁻² | 605 | 61.5 | 0.4 |
| EXAMPLE 23 | Si₃N₄ | 99Al | 10Si—Al | 0.15 | 2Ce—Al | 0.3 | 0.5 | 10⁻² | 610 | 55.9 | 1.6 |
| EXAMPLE 24 | Si₃N₄ | 95Al | 10Si—Al | 0.5 | 2Dy—Al | 0.8 | 0.2 | 10⁻² | 600 | 48.4 | 2.2 |
| EXAMPLE 25 | Si₃N₄ | 99Al | 7.5Si—Al | 0.1 | 4Th—Al | 0.1 | 1 | 10⁻² | 605 | 45.5 | 6 |
| EXAMPLE 26 | Si₃N₄ | 99Al | 7.5Si—Al | 0.3 | 3Y—Al | 0.5 | 2 | 10⁻² | 600 | 62.7 | 0 |
| EXAMPLE 27 | Si₃N₄ | 98Al | 7.5Si—Al | 0.5 | 5Tb—Al | 0.3 | 1 | 10⁻² | 615 | 51.8 | 3.6 |
| EXAMPLE 28 | Si₃N₄ | 98Al | 7.5Si—Al | 0.3 | 4La—Al | 0.5 | 1.5 | 10⁻² | 620 | 58.9 | 0.2 |
| EXAMPLE 29 | Si₃N₄ | 99Al | 7.5Si—Al | 0.2 | 1Gd—Al | 0.2 | 0.2 | 10⁻² | 620 | 51.2 | 3.3 |
| EXAMPLE 30 | Si₃N₄ | 99Al | 7.5Si—Al | 0.4 | 5Er—Al | 0.1 | 0.5 | 10⁻² | 615 | 55.6 | 1.5 |

TABLE 2

| SAMPLE No. | KIND OF CERAMIC SUBSTRATE | STRUCTURE OF CLAD MEMBER (CIRCUIT LAYER) | | | Al ALLOY FILM ON SURFACE OF CERAMIC SUBSTRATE | | JOINING TREATMENT | | | | VOID AREA RATIO (%) |
|---|---|---|---|---|---|---|---|---|---|---|---|
| | | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (μm) | PRESSING LOAD (MPa) | DEGREE OF VACUUM (Pa) | TEMPER-ATURE (°C.) | JOINING STRENGTH (N/20 mm) | |
| EXAMPLE 31 | Si₃N₄ | 98Al | 7.5Si—Al | 0.3 | 4Ce—Al | 0.2 | 1.5 | 10⁻² | 615 | 60.1 | 0.1 |
| EXAMPLE 32 | Si₃N₄ | 95Al | 7.5Si—Al | 0.2 | 5Dy—Al | 0.3 | 0.3 | 10⁻² | 630 | 51.6 | 0.9 |
| EXAMPLE 33 | Si₃N₄ | 99Al | 6Si—Al | 0.3 | 3Y—Al | 0.8 | 0.5 | 10⁻² | 630 | 57.9 | 0.9 |
| EXAMPLE 34 | Si₃N₄ | 98Al | 6Si—Al | 0.5 | 5Nd—Al | 0.8 | 1 | 10⁻² | 630 | 54.3 | 1.8 |
| EXAMPLE 35 | Si₃N₄ | 97Al | 6Si—Al | 0.3 | 1Nd—Al | 0.5 | 0.2 | 10⁻² | 630 | 50.9 | 4.8 |
| EXAMPLE 36 | Si₃N₄ | 95Al | 6Si—Al | 0.2 | 3Gd—0.5Y—Al | 0.3 | 0.5 | 10⁻² | 630 | 57.6 | 1.6 |
| EXAMPLE 37 | Si₃N₄ | 95Al | 7.5Si—Al | 0.15 | 2Ce—Er—Al | 0.5 | 1 | 10⁻² | 620 | 58.1 | 0.8 |
| EXAMPLE 38 | Si₃N₄ | 97Al | 12Si—Al | 0.5 | 3Gd—0.5Y—Al | 0.1 | 0.5 | 10⁻² | 580 | 55.8 | 1.8 |
| EXAMPLE 39 | Si₃N₄ | 95Al | 15Si—Al | 0.3 | 3Nd—La—Al | 0.3 | 1 | 10⁻² | 615 | 59.6 | 0.3 |
| EXAMPLE 40 | Si₃N₄ | 98Al | 7.5Si—Al | 0.5 | 3Nd—La—Al | 0.8 | 0.5 | 10⁻² | 615 | 54.1 | 1.6 |
| EXAMPLE 41 | AlN | 99Al | 15Si—Al | 0.2 | 3Y—Al | 0.3 | 0.5 | 10⁻² | 615 | 58.3 | 1 |
| EXAMPLE 42 | AlN | 97Al | 15Si—Al | 0.2 | 3Nd—Al | 0.5 | 0.5 | 10⁻² | 615 | 56.6 | 1.9 |
| EXAMPLE 43 | AlN | 99Al | 12Si—Al | 0.15 | 3Y—Al | 0.3 | 0.5 | 10⁻² | 580 | 65.7 | 0 |
| EXAMPLE 44 | AlN | 98Al | 12Si—Al | 0.2 | 5Gd—Al | 0.6 | 0.2 | 10⁻² | 580 | 56.9 | 1.8 |
| EXAMPLE 45 | AlN | 99Al | 10Si—Al | 0.5 | 3Y—Al | 0.3 | 1.5 | 10⁻² | 600 | 63.8 | 0 |
| EXAMPLE 46 | AlN | 97Al | 10Si—Al | 0.2 | 2Sr—Al | 0.8 | 1 | 10⁻² | 590 | 59.1 | 0.5 |
| EXAMPLE 47 | AlN | 99Al | 10Si—Al | 0.15 | 2Ce—Al | 0.5 | 0.5 | 10⁻² | 600 | 57 | 1.8 |
| EXAMPLE 48 | AlN | 95Al | 10Si—Al | 0.5 | 2Dy—Al | 0.2 | 0.2 | 10⁻² | 605 | 58.6 | 1.5 |
| EXAMPLE 49 | AlN | 99Al | 7.5Si—Al | 0.1 | 4Th—Al | 0.2 | 0.2 | 10⁻² | 605 | 51.3 | 4.6 |
| EXAMPLE 50 | AlN | 98Al | 7.5Si—Al | 0.3 | 3Y—Al | 0.3 | 1 | 10⁻² | 610 | 62.8 | 0.1 |
| EXAMPLE 51 | AlN | 98Al | 7.5Si—Al | 0.5 | 5Tb—Al | 0.1 | 0.2 | 10⁻² | 610 | 53.6 | 2.3 |
| EXAMPLE 52 | AlN | 99Al | 7.5Si—Al | 0.4 | 5Er—Al | 0.6 | 1.5 | 10⁻² | 605 | 55.5 | 2 |
| EXAMPLE 53 | AlN | 99Al | 7.5Si—Al | 0.2 | 5Dy—Al | 0.8 | 2 | 10⁻² | 615 | 64 | 0 |
| EXAMPLE 54 | AlN | 99Al | 6Si—Al | 0.3 | 3Y—Al | 0.3 | 0.5 | 10⁻² | 630 | 60.3 | 1 |
| EXAMPLE 55 | AlN | 95Al | 6Si—Al | 0.2 | 3Ce—1.5Sr—Al | 0.5 | 0.5 | 10⁻² | 630 | 59.1 | 0.2 |
| EXAMPLE 56 | AlN | 95Al | 15Si—Al | 0.3 | 3La—2Gd—Al | 0.8 | 1 | 10⁻² | 620 | 58.3 | 0.9 |
| EXAMPLE 57 | AlN | 97Al | 12Si—Al | 0.5 | 3.5Er—0.5Y—Al | 0.3 | 1 | 10⁻² | 580 | 62.5 | 0 |
| EXAMPLE 58 | AlN | 98Al | 7.5Si—Al | 0.5 | 2Sr—2Dy—Al | 0.6 | 0.5 | 10⁻² | 615 | 58.4 | 1.2 |
| EXAMPLE 59 | AlN | 95Al | 7.5Si—Al | 0.15 | 2Sm—1Nd—Al | 0.5 | 0.2 | 10⁻² | 620 | 54.9 | 2.4 |
| EXAMPLE 60 | Si—Al—O—N | 99Al | 15Si—Al | 0.2 | 3Y—Al | 0.3 | 0.5 | 10⁻² | 625 | 53.4 | 2 |

TABLE 3

| SAMPLE No. | KIND OF CERAMIC SUBSTRATE | STRUCTURE OF CLAD MEMBER (CIRCUIT LAYER) | | | Al ALLOY FILM ON SURFACE OF CERAMIC SUBSTRATE | | JOINING TREATMENT | | | | JOINING STRENGTH (N/20 mm) | VOID AREA RATIO (%) |
|---|---|---|---|---|---|---|---|---|---|---|---|---|
| | | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (μm) | PRESSING LOAD (MPa) | DEGREE OF VACUUM (Pa) | TEMPERATURE (°C.) | | | |
| EXAMPLE 61 | Si—Al-O-N | 97Al | 15Si—Al | 0.2 | 3Nd—Al | 0.5 | 0.2 | $10^{-2}$ | 620 | | 50.9 | 38 |
| EXAMPLE 62 | Si—Al-O-N | 99Al | 12Si—Al | 0.15 | 3Y—Al | 0.3 | 1.5 | $10^{-2}$ | 580 | | 61.6 | 0 |
| EXAMPLE 63 | Si—Al-O-N | 98Al | 12Si—Al | 0.2 | 5Gd—Al | 0.6 | 1.5 | $10^{-2}$ | 580 | | 59.2 | 0.2 |
| EXAMPLE 64 | Si—Al-O-N | 99Al | 10Si—Al | 0.5 | 3Y—Al | 0.3 | 2 | $10^{-2}$ | 600 | | 63.8 | 0 |
| EXAMPLE 65 | Si—Al-O-N | 97Al | 10Si—Al | 0.2 | 2Sr—Al | 0.8 | 0.5 | $10^{-2}$ | 605 | | 52.6 | 1.8 |
| EXAMPLE 66 | Si—Al-O-N | 99Al | 10Si—Al | 0.15 | 2Ce—Al | 0.5 | 1 | $10^{-2}$ | 610 | | 55.2 | 0.9 |
| EXAMPLE 67 | Si—Al-O-N | 95Al | 10Si—Al | 0.5 | 2Dy—Al | 0.2 | 0.5 | $10^{-2}$ | 610 | | 55.5 | 1.4 |
| EXAMPLE 68 | Si—Al-O-N | 99Al | 7.5Si—Al | 0.1 | 4Th—Al | 0.2 | 0.2 | $10^{-2}$ | 610 | | 46.4 | 8.2 |
| EXAMPLE 69 | Si—Al-O-N | 99Al | 7.5Si—Al | 0.3 | 3Y—Al | 0.3 | 1 | $10^{-2}$ | 615 | | 59.9 | 0.3 |
| EXAMPLE 70 | Si—Al-O-N | 98Al | 7.5Si—Al | 0.5 | 5Tb—Al | 0.1 | 0.2 | $10^{-2}$ | 620 | | 51.1 | 2.6 |
| EXAMPLE 71 | Si—Al-O-N | 99Al | 7.5Si—Al | 0.4 | 5Er—Al | 0.6 | 0.5 | $10^{-2}$ | 630 | | 54.3 | 1.5 |
| EXAMPLE 72 | Si—Al-O-N | 95Al | 7.5Si—Al | 0.2 | 5Dy—Al | 0.8 | 1 | $10^{-2}$ | 620 | | 52.8 | 4.2 |
| EXAMPLE 73 | Si—Al-O-N | 99Al | 7.5Si—Al | 0.3 | 3Y—Al | 0.3 | 1.5 | $10^{-2}$ | 630 | | 57.8 | 0.9 |
| EXAMPLE 74 | Si—Al-O-N | 95Al | 6Si—Al | 0.2 | 3Tb—0.5Y—Al | 0.8 | 0.2 | $10^{-2}$ | 630 | | 50.3 | 4.5 |
| EXAMPLE 75 | Si—Al-O-N | 95Al | 15Si—Al | 0.3 | 2.5Dy—2Y—Al | 0.3 | 0.5 | $10^{-2}$ | 620 | | 54.9 | 2.3 |
| EXAMPLE 76 | Si—Al-O-N | 97Al | 12Si—Al | 0.5 | 3.5Th—1Ce—Al | 0.5 | 1 | $10^{-2}$ | 580 | | 59.6 | 0.4 |
| EXAMPLE 77 | Si—Al-O-N | 98Al | 7.5Si—Al | 0.5 | 3Y—2Gd—Al | 0.8 | 0.2 | $10^{-2}$ | 615 | | 48.6 | 6.4 |
| EXAMPLE 78 | Si—Al-O-N | 95Al | 7.5Si—Al | 0.15 | 2.5Nd—2Th—Al | 0.2 | 1 | $10^{-2}$ | 620 | | 53.2 | 4.8 |
| EXAMPLE 79 | SiC | 99Al | 15Si—Al | 0.2 | 3Nd—Al | 0.3 | 0.5 | $10^{-2}$ | 615 | | 51.2 | 0.5 |
| EXAMPLE 80 | SiC | 97Al | 15Si—Al | 0.2 | 3Y—Al | 0.5 | 0.2 | $10^{-2}$ | 610 | | 48.6 | 0.9 |
| EXAMPLE 81 | SiC | 99Al | 12Si—Al | 0.15 | 5Gd—Al | 0.3 | 1.5 | $10^{-2}$ | 580 | | 57.8 | 0 |
| EXAMPLE 82 | SiC | 98Al | 12Si—Al | 0.2 | 3Y—Al | 0.6 | 0.2 | $10^{-2}$ | 600 | | 53.5 | 0.3 |
| EXAMPLE 83 | SiC | 99Al | 10Si—Al | 0.5 | 3Y—Al | 0.3 | 1 | $10^{-2}$ | 600 | | 56.7 | 0 |
| EXAMPLE 84 | SiC | 97Al | 10Si—Al | 0.2 | 2Sr—Al | 0.8 | 1 | $10^{-2}$ | 610 | | 52.6 | 0.2 |
| EXAMPLE 85 | SiC | 99Al | 10Si—Al | 0.15 | 2Ce—Al | 0.5 | 0.2 | $10^{-2}$ | 610 | | 47.8 | 1.6 |
| EXAMPLE 86 | SiC | 95Al | 10Si—Al | 0.5 | 2Dy—Al | 0.2 | 0.5 | $10^{-2}$ | 600 | | 49.8 | 1.2 |
| EXAMPLE 87 | SiC | 99Al | 7.5Si—Al | 0.1 | 4Th—Al | 0.2 | 0.2 | $10^{-2}$ | 615 | | 41.9 | 4.8 |
| EXAMPLE 88 | SiC | 99Al | 7.5Si—Al | 0.3 | 3Y—Al | 0.3 | 2 | $10^{-2}$ | 615 | | 55.9 | 0 |
| EXAMPLE 89 | SiC | 98Al | 7.5Si—Al | 0.5 | 5Tb—Al | 0.1 | 0.5 | $10^{-2}$ | 620 | | 43.6 | 2.1 |
| EXAMPLE 90 | SiC | 99Al | 7.5Si—Al | 0.4 | 5Er—Al | 0.6 | 2.5 | $10^{-2}$ | 610 | | 56.1 | 0 |

TABLE 4

| SAMPLE No. | STRUCTURE OF CLAD MEMBER (CIRCUIT LAYER) | | | | Al ALLOY FILM ON SURFACE OF CERAMIC SUBSTRATE | | JOINING TREATMENT | | | | VOID AREA RATIO (%) |
|---|---|---|---|---|---|---|---|---|---|---|---|
| | KIND OF CERAMIC SUBSTRATE | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (μm) | PRESSING LOAD (MPa) | DEGREE OF VACUUM (Pa) | TEMPER-ATURE (°C.) | JOINING STRENGTH (N/20 mm) | |
| EXAMPLE 91 | SiC | 95Al | 7.5Si—Al | 0.2 | 5Dy—Al | 0.8 | 1 | $10^{-2}$ | 615 | 44 | 2.5 |
| EXAMPLE 92 | SiC | 99Al | 6Si—Al | 0.3 | 3Y—Al | 0.3 | 0.5 | $10^{-2}$ | 630 | 51.3 | 0 |
| EXAMPLE 93 | SiC | 95Al | 6Si—Al | 0.2 | 3Tb—1.5Er—Al | 0.8 | 0.5 | $10^{-2}$ | 630 | 48.7 | 0.4 |
| EXAMPLE 94 | SiC | 95Al | 15Si—Al | 0.3 | 3La—0.5Sm—Al | 0.8 | 0.2 | $10^{-2}$ | 620 | 43.5 | 2.5 |
| EXAMPLE 95 | SiC | 97Al | 12Si—Al | 0.5 | 4Sm—0.5Y—Al | 0.5 | 0.2 | $10^{-2}$ | 580 | 42.6 | 3.2 |
| EXAMPLE 96 | SiC | 98Al | 7.5Si—Al | 0.5 | 2.5Y—1Sr—Al | 0.5 | 1 | $10^{-2}$ | 615 | 49.8 | 0.7 |
| EXAMPLE 97 | SiC | 95Al | 7.5Si—Al | 0.15 | 2.5Y—2Nd—Al | 0.2 | 1 | $10^{-2}$ | 615 | 42.4 | 3.3 |
| EXAMPLE 98 | $Al_2O_3$ | 99Al | 15Si—Al | 0.2 | 3Y—Al | 0.3 | 0.5 | $10^{-2}$ | 600 | 60.8 | 0.2 |
| EXAMPLE 99 | $Al_2O_3$ | 97Al | 15Si—Al | 0.2 | 3Nd—Al | 0.5 | 1 | $10^{-2}$ | 600 | 64.5 | 0.1 |
| EXAMPLE 100 | $Al_2O_3$ | 99Al | 12Si—Al | 0.15 | 3Y—Al | 0.3 | 1.5 | $10^{-2}$ | 580 | 66 | 0 |
| EXAMPLE 101 | $Al_2O_3$ | 98Al | 12Si—Al | 0.2 | 5Gd—Al | 0.6 | 0.5 | $10^{-2}$ | 580 | 61.2 | 0.5 |
| EXAMPLE 102 | $Al_2O_3$ | 99Al | 10Si—Al | 0.5 | 3Y—Al | 0.3 | 2 | $10^{-2}$ | 595 | 65.8 | 0 |
| EXAMPLE 103 | $Al_2O_3$ | 97Al | 10Si—Al | 0.2 | 2Sr—Al | 0.8 | 1 | $10^{-2}$ | 600 | 60.5 | 2.5 |
| EXAMPLE 104 | $Al_2O_3$ | 99Al | 10Si—Al | 0.15 | 2Ce—Al | 0.5 | 0.2 | $10^{-2}$ | 610 | 61.8 | 6 |
| EXAMPLE 105 | $Al_2O_3$ | 95Al | 10Si—Al | 0.5 | 2Dy—Al | 0.2 | 0.5 | $10^{-2}$ | 600 | 60.4 | 4.2 |
| EXAMPLE 106 | $Al_2O_3$ | 99Al | 7.5Si—Al | 0.1 | 4Th—Al | 0.2 | 0.5 | $10^{-2}$ | 615 | 58.8 | 2.9 |
| EXAMPLE 107 | $Al_2O_3$ | 99Al | 7.5Si—Al | 0.3 | 3Y—Al | 0.3 | 1 | $10^{-2}$ | 610 | 64.2 | 0.1 |
| EXAMPLE 108 | $Al_2O_3$ | 98Al | 7.5Si—Al | 0.5 | 5Tb—Al | 0.1 | 0.5 | $10^{-2}$ | 610 | 60.7 | 3.6 |
| EXAMPLE 109 | $Al_2O_3$ | 99Al | 7.5Si—Al | 0.4 | 5Er—Al | 0.6 | 1 | $10^{-2}$ | 600 | 61.3 | 1.9 |
| EXAMPLE 110 | $Al_2O_3$ | 95Al | 7.5Si—Al | 0.2 | 5Dy—Al | 0.8 | 1.5 | $10^{-2}$ | 615 | 64.8 | 0.4 |
| EXAMPLE 111 | $Al_2O_3$ | 99Al | 6Si—Al | 0.3 | 3Y—Al | 0.3 | 1.5 | $10^{-2}$ | 620 | 62.1 | 0.5 |
| EXAMPLE 112 | $Al_2O_3$ | 95Al | 6Si—Al | 0.2 | 4Gd—0.5Y—Al | 0.2 | 1 | $10^{-2}$ | 620 | 61.5 | 3 |
| EXAMPLE 113 | $Al_2O_3$ | 95Al | 15Si—Al | 0.3 | 4Nd—0.5Sm—Al | 0.8 | 1 | $10^{-2}$ | 620 | 63.8 | 0.4 |
| EXAMPLE 114 | $Al_2O_3$ | 97Al | 12Si—Al | 0.5 | 3.5Er—0.5Y—Al | 0.5 | 2 | $10^{-2}$ | 580 | 63.6 | 0 |
| EXAMPLE 115 | $Al_2O_3$ | 98Al | 7.5Si—Al | 0.5 | 3Gd—0.5Y—Al | 0.6 | 0.2 | $10^{-2}$ | 615 | 63.6 | 2.1 |
| EXAMPLE 116 | $Al_2O_3$ | 95Al | 7.5Si—Al | 0.15 | 2Ce—Er—Al | 0.2 | 0.2 | $10^{-2}$ | 620 | 59.7 | 3.1 |

TABLE 5

| SAMPLE No. | STRUCTURE OF CLAD MEMBER (CIRCUIT LAYER) | | | Al ALLOY FILM ON SURFACE OF CERAMIC SUBSTRATE | | JOINING TREATMENT | | | | VOID AREA RATIO (%) |
|---|---|---|---|---|---|---|---|---|---|---|
| | KIND OF CERAMIC SUBSTRATE | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (µm) | PRESSING LOAD (MPa) | DEGREE OF VACUUM (Pa) | TEMPERATURE (°C.) | JOINING STRENGTH (N/20 mm) | |
| C. EXAMPLE 1 | $Si_3N_4$ | 98Al | 15Si—Al | 0.2 | 100Al | 0.3 | 0.8 | $10^{-2}$ | 650 | 30.2 | 28.1 |
| C. EXAMPLE 2 | $Si_3N_4$ | 97Al | 18Si—Al | 0.4 | 4Gd—Al | 0.1 | 1 | $10^{-2}$ | 600 | 36.3 | 18.2 |
| C. EXAMPLE 3 | AlN | 98Al | 10Si—Al | 0.5 | 4Y—1Ce—Al | 1.1 | 0.6 | $10^{-2}$ | 590 | 33.9 | 13.2 |
| C. EXAMPLE 4 | Si—Al-O-N | 97Al | 5Si—Al | 0.3 | 4Nd—Al | 0.2 | 0.6 | $10^{-2}$ | 600 | 29.4 | 20.5 |
| C. EXAMPLE 5 | SiC | 96Al | 7.5Si—Al | 0.5 | 4Y—Al | 0.3 | 0.5 | $10^{-2}$ | 570 | 10.5 | 61.7 |
| C. EXAMPLE 6 | $Al_2O_3$ | 98Al | 10Si—Al | 0.3 | 3Tb—Al | 0.5 | 0.1 | $10^{-2}$ | 630 | 24.6 | 55.1 |
| C. EXAMPLE 7 | AlN | 97Al | 7.5Si—Al | 0.5 | 10Y—Al | 0.5 | 0.5 | $10^{-2}$ | 600 | 38.3 | 15.8 |
| C. EXAMPLE 8 | $Si_3N_4$ | 99Al | 10Si—Al | 0.3 | 10Y—Al | 0.5 | 0.5 | $10^{-2}$ | 600 | 28.4 | 22.5 |
| C. EXAMPLE 9 | $Si_3N_4$ | 99Al | 10Si—Al | 0.3 | 10Sc—Al | 0.5 | 0.5 | $10^{-2}$ | 600 | 24.6 | 26.4 |
| C. EXAMPLE 10 | AlN | 99Al | 10Si—Al | 0.3 | 10La—Al | 0.5 | 0.5 | $10^{-2}$ | 600 | 27.2 | 20 |
| C. EXAMPLE 11 | AlN | 99Al | 10Si—Al | 0.3 | 10Ce—Al | 0.5 | 0.5 | $10^{-2}$ | 600 | 33.6 | 15.8 |
| C. EXAMPLE 12 | AlN | 99Al | 10Si—Al | 0.3 | 10Nd—Al | 0.5 | 0.5 | $10^{-2}$ | 600 | 30.2 | 16.7 |
| C. EXAMPLE 13 | AlN | 98Al | 10Si—Al | 0.3 | 10Sm—Al | 0.5 | 0.5 | $10^{-2}$ | 600 | 28.7 | 21.5 |
| C. EXAMPLE 14 | $Al_2O_3$ | 99Al | 10Si—Al | 0.3 | 10Gd—Al | 0.5 | 0.5 | $10^{-2}$ | 600 | 33 | 17 |
| C. EXAMPLE 15 | $Al_2O_3$ | 99Al | 10Si—Al | 0.3 | 10Tb—Al | 0.5 | 0.5 | $10^{-2}$ | 600 | 31.2 | 20.1 |
| C. EXAMPLE 16 | $Al_2O_3$ | 99Al | 10Si—Al | 0.3 | 10Dy—Al | 0.5 | 0.5 | $10^{-2}$ | 600 | 37.3 | 15.8 |
| C. EXAMPLE 17 | SiC | 99Al | 10Si—Al | 0.3 | 10Er—Al | 0.5 | 0.5 | $10^{-2}$ | 600 | 31.3 | 15.2 |
| C. EXAMPLE 18 | SiC | 99Al | 10Si—Al | 0.3 | 10Th—Al | 0.5 | 0.5 | $10^{-2}$ | 600 | 32.5 | 15.1 |
| C. EXAMPLE 19 | Si—Al-O-N | 99Al | 10Si—Al | 0.3 | 10Si—Al | 0.5 | 0.5 | $10^{-2}$ | 600 | 29.4 | 17.5 |
| C. EXAMPLE 20 | $Si_3N_4$ | 99Al | 12Si—Al | 0.3 | 3Y—Al | 1.5 | 0.5 | $10^{-2}$ | 580 | 30.4 | 15.9 |

NOTE:
C. EXAMPLE denotes COMPARATIVE EXAMPLE.

TABLE 6

| SAMPLE No. | STRUCTURE OF CLAD MEMBER (CIRCUIT LAYER) | | | Al ALLOY FILM ON SURFACE OF CERAMIC SUBSTRATE | | JOINING TREATMENT | | | | VOID AREA RATIO (%) |
|---|---|---|---|---|---|---|---|---|---|---|
| | KIND OF CERAMIC SUBSTRATE | Al CONTENT IN CIRCUIT LAYER (MASS %) | COMPOSITION OF Al—Si BRAZING MATERIAL (MASS %) | TOTAL THICKNESS (mm) | COMPOSITION (at %) | THICKNESS (μm) | PRESSING LOAD (MPa) | DEGREE OF VACUUM (Pa) | TEMPERATURE (°C) | JOINING STRENGTH (N/20 mm) | |
| C. EXAMPLE 21 | $Si_3N_4$ | 99Al | 12Si—Al | 0.3 | 3Y—Al | 0.3 | 0.1 | $10^{-2}$ | 580 | 10.4 | 68.8 |
| C. EXAMPLE 22 | $Si_3N_4$ | 99Al | 12Si—Al | 0.3 | 3Y—Al | 0.3 | 0.5 | $10^{-2}$ | 570 | 11.6 | 65.2 |
| C. EXAMPLE 23 | $Si_3N_4$ | 99Al | 6Si—Al | 0.3 | 3Y—Al | 0.3 | 0.5 | $10^{-2}$ | 640 | 28.7 | 30.4 |
| C. EXAMPLE 24 | AlN | 99Al | 12Si—Al | 0.3 | 3Y—Al | 0.3 | 0.5 | $10^{-2}$ | 640 | 25.9 | 33.2 |
| C. EXAMPLE 25 | AlN | 98Al | 18Si—Al | 0.3 | 100Al | 0.3 | 0.8 | $10^{-2}$ | 580 | 38.7 | 21.3 |
| C. EXAMPLE 26 | $Si_3N_4$ | 99Al | 5Si—Al | 0.3 | 3Y—Al | 0.3 | 0.5 | $10^{-2}$ | 580 | 21.6 | 46.7 |
| C. EXAMPLE 27 | Si—Al-0-N | 99Al | 12Si—Al | 0.3 | 3Y—Al | 0.3 | 0.5 | $10^{-2}$ | 580 | 33.4 | 22.6 |
| C. EXAMPLE 28 | Si—Al-1-N | 99Al | 10Si—Al | 0.3 | 3Nd—Al | 1.5 | 0.5 | $10^{-2}$ | 600 | 28.9 | 15.7 |
| C. EXAMPLE 29 | $Si_3N_4$ | 99Al | 10Si—Al | 0.3 | 3Nd—Al | 0.3 | 0.1 | $10^{-2}$ | 600 | 12.1 | 64.5 |
| C. EXAMPLE 30 | $Si_3N_4$ | 99Al | 10Si—Al | 0.3 | 3Gd—Al | 1.5 | 0.5 | $10^{-2}$ | 600 | 34.2 | 20.6 |
| C. EXAMPLE 31 | SiC | 99Al | 10Si—Al | 0.3 | 3Gd—Al | 0.3 | 0.1 | $10^{-2}$ | 600 | 9.8 | 74.3 |
| C. EXAMPLE 32 | SiC | 99Al | 12Si—Al | 0.3 | 3Er—Al | 0.3 | 0.5 | $10^{-2}$ | 570 | 28.6 | 23.2 |
| C. EXAMPLE 33 | $Si_3N_4$ | 99Al | 6Si—Al | 0.3 | 3Ce—Al | 0.3 | 0.5 | $10^{-2}$ | 640 | 34.5 | 18.2 |
| C. EXAMPLE 34 | $Si_3N_4$ | 99Al | 12Si—Al | 0.3 | 3Nd—Al | 0.3 | 0.5 | $10^{-2}$ | 640 | 28.2 | 15.9 |
| C. EXAMPLE 35 | AlN | 99Al | 18Si—Al | 0.3 | 4Gd—Al | 0.3 | 0.5 | $10^{-2}$ | 580 | 35.6 | 13.6 |
| C. EXAMPLE 36 | $Al_2O_3$ | 99Al | 5Si—Al | 0.3 | 4Sc—Al | 0.3 | 0.5 | $10^{-2}$ | 580 | 31.2 | 16.8 |
| C. EXAMPLE 37 | $Si_3N_4$ | 99Al | 10Si—Al | 0.3 | 5Gd—3Y—Al | 0.5 | 0.5 | $10^{-2}$ | 600 | 31.2 | 16.7 |
| C. EXAMPLE 38 | Si—Al-0-N | 99Al | 10Si—Al | 0.3 | 5Ce—3Er—Al | 0.5 | 0.5 | $10^{-2}$ | 600 | 36.6 | 15.5 |
| C. EXAMPLE 39 | AlN | 99Al | 18Si—Al | 0.3 | 5Gd—3Y—Al | 0.5 | 0.5 | $10^{-2}$ | 600 | 33.4 | 18 |
| C. EXAMPLE 40 | $Al_2O_3$ | 99Al | 10Si—Al | 0.3 | 5Nd—3La—Al | 0.5 | 0.5 | $10^{-2}$ | 600 | 30.8 | 19.6 |
| C. EXAMPLE 41 | SiC | 99Al | 10Si—Al | 0.3 | 5Y—5Er—Al | 0.5 | 0.5 | $10^{-2}$ | 600 | 33.4 | 15.1 |
| C. EXAMPLE 42 | $Si_3N_4$ | 99Al | 12Si—Al | 0.3 | 4Gd—0.5Y—Al | 0.5 | 0.5 | $10^{-2}$ | 570 | 19.5 | 23 |
| C. EXAMPLE 43 | $Al_2O_3$ | 99Al | 6Si—Al | 0.3 | 4Nd—0.5Sm—Al | 0.5 | 0.5 | $10^{-2}$ | 640 | 20.5 | 35.6 |
| C. EXAMPLE 44 | AlN | 99Al | 12Si—Al | 0.3 | 3.5Er—0.5Y—Al | 0.5 | 0.5 | $10^{-2}$ | 640 | 34.1 | 17.4 |
| C. EXAMPLE 45 | AlN | 99Al | 10Si—Al | 0.3 | 3Gd—0.5Y—Al | 0.5 | 0.5 | $10^{-2}$ | 640 | 32.5 | 18.5 |

NOTE:
C. EXAMPLE denotes COMPARATIVE EXAMPLE.

As is apparent from the results shown in Tables 1 to 6, according to the ceramic circuit boards of the examples each prepared by forming an Al alloy film having a predetermined thickness on the surface of the ceramic substrate, even when the thickness of the Al alloy film is small to be less than 1 µm, the void area ratio was smaller than that of the comparative examples. This result showed that the diffusion and the ejection (the hillock phenomenon) of Al elements on the joint surface during joining by heating were effectively suppressed.

Therefore, it was confirmed that the generation of voids in the joint surface could be effectively prevented and the joint strength was drastically increased and thus improved. Furthermore, since the thickness of the Al alloy film could be decreased to be less than 1 µm, the time required for depositing the Al alloy film by vapor deposition or the like could be reduced and the joining operation could be simplified. Therefore, it became clear that the joint assembly of the circuit board could be simplified to reduce the production cost drastically.

On the other hand, according to the ceramic circuit board of Comparative Example 1 prepared by forming an Al metal layer on the surface of the ceramic substrate in advance, the diffusion of Al elements during joining by heating was significant and the ejection (the hillock phenomenon) of Al elements on the joint surface was not suppressed. It was reconfirmed that the joint strength was also drastically decreased in proportion to the sharp increase in the void area ratio.

In addition, as shown in Comparative Examples 2 to 7, the results showed that when the composition of the Al alloy film (Comparative Examples 1 and 7), the joint temperature (Comparative Examples 1 and 5), the composition of Al—Si brazing material (Comparative Examples 2 and 4), the thickness of the Al alloy film (Comparative Example 3), the pressure during joining (Comparative Example 6), or the like were out of the preferred range specified in the present invention, the joint strength of the circuit layer and the void area property were decreased.

Figure 2:
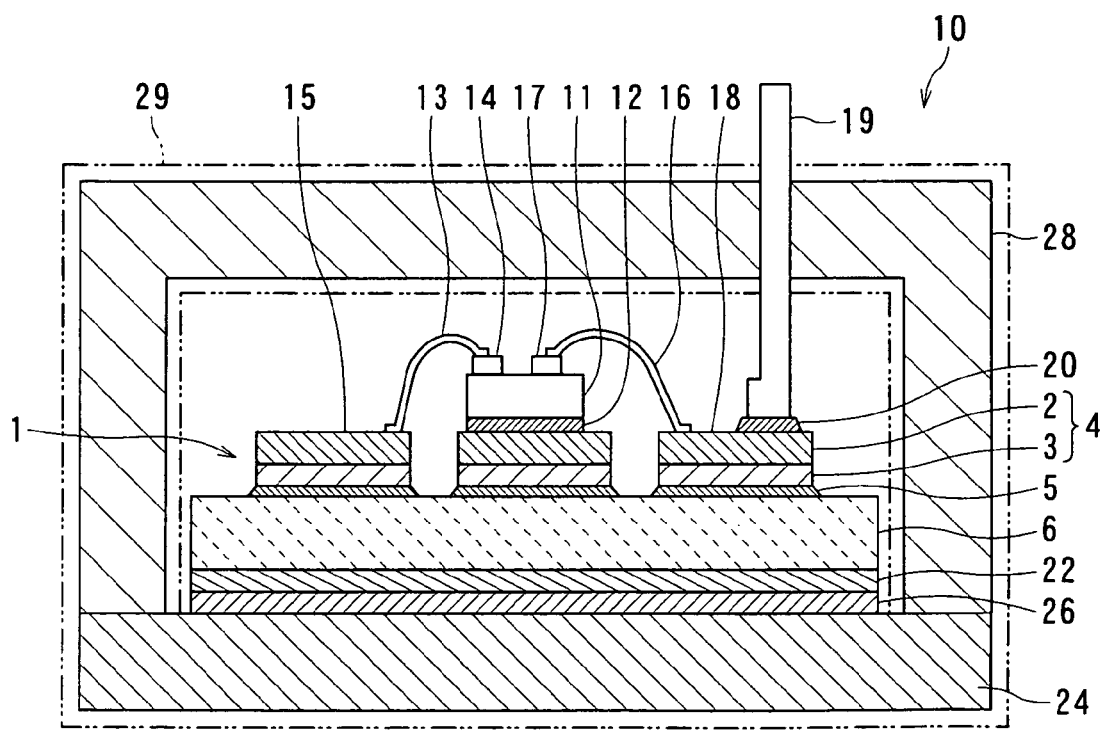
FIG. 2 is a cross-sectional view showing an example of the structure of a power module including the ceramic circuit board according to the present invention.

FIG. 2 is a cross-sectional view showing an example of the structure of a power module including the ceramic circuit board according to an embodiment of the present invention. Namely, on the surface of an Al circuit plate 2 of a ceramic circuit board 1 disposed in a power module 10 of this embodiment, a semiconductor chip (semiconductor element) 11 including an IGBT (insulated gate bipolar transistor) serving as a power device is fixed with solder 12.

The Al circuit plate 2 is connected to an electrode terminal (not shown in the figure) for a collector and supplies the semiconductor chip 11 with a collector voltage. Both ends of a bonding wire 13 composed of a fine wire of a metal such as Al or Au are bonded to a gate electrode 14 on the semiconductor chip 11 and a metal film 15 on a ceramic substrate 6, respectively, by using ultrasonic welding. Since the metal film 15 is connected to an electrode terminal (not shown in the figure) for a gate, the bonding wire 13 is electrically connected to the electrode terminal for the gate. Thus, a gate voltage is supplied from the electrode terminal for the gate through the bonding wire 13.

Further, both ends of a bonding wire 16 are bonded to an emitter electrode 17 on the semiconductor chip 11 and a metal film 18 on the ceramic substrate 6, respectively, by using ultrasonic welding. Since an electrode terminal 19 for an emitter is bonded on the metal film 18 with solder 20, the bonding wire 16 is electrically connected to the electrode terminal 19 for the emitter. Thus, an emitter voltage is supplied from the electrode terminal 19 for the emitter through the bonding wire 16.

The bottom face of the ceramic substrate 6 is joined on a metal substrate (heat sink) 24 with a metal film 22 and solder 26 that are provided therebetween. An outer shell case 28 composed of a plastic material or the like and the metal substrate 24 constitute a package 29. The semiconductor chip 11, the ceramic substrate 6, the Al circuit layer 2, the metal films 15 and 18, the bonding wires 13 and 16, and a part of the electrode terminal 19 for the emitter are sealed in the package 29 to constitute the single power module 10. The metal substrate 24 can be formed as a component also serving as a heat sink, but radiation fins (heat sink) may be separately provided in addition to the metal substrate 24. Heat generated from the semiconductor chip 11 is dissipated to the bottom face side of the semiconductor chip 11 through the metal substrate 24, thereby cooling the semiconductor chip 11. Thus, the operation and the function of the semiconductor chip 11 are satisfactorily maintained.

According to the power module of the embodiment having the above-described structure, the generation of voids in the joint interface of the ceramic substrate can be effectively suppressed, and thus the joint strength of the metal member serving as the circuit layer can be increased. Consequently, a power module in which the heat resistance cycle characteristics can be drastically improved can be obtained and satisfactory reliability can be ensured.

INDUSTRIAL APPLICABILITY

According to the ceramic circuit board, the method for producing the same, and the power module of the present invention, since an Al alloy film having a predetermined thickness is formed on the surface of a ceramic substrate, even when the thickness of this Al alloy film is small to be less than 1 µm, the diffusion and the ejection (the hillock phenomenon) of Al elements on the joint surface during joining by heating can be effectively suppressed, the generation of voids in the joint surface can be effectively prevented, and the joint assembly of the circuit board can be simplified thereby to reduce the production cost drastically.

The invention claimed is:

1. A ceramic circuit board prepared by a method that comprises integrally joining a circuit layer comprising a clad member that comprises an Al plate and an Al—Si brazing material to a ceramic substrate, wherein a surface of said clad member adjacent to the Al—Si brazing material is joined to said ceramic substrate with an Al alloy film therebetween, said Al alloy film having a thickness of less than 1 µm and provided on the surface of the ceramic substrate, and
    wherein said Al alloy film comprises at least one rare earth element selected from the group consisting of Y, Sc, La, Ce, Nd, Sm, Gd, Tb, Dy, Er, Th, and Sr in an amount of 1 to 5 atomic percent.

2. The ceramic circuit board according to claim 1, wherein said ceramic substrate comprises an aluminum nitride sintered body, a silicon nitride sintered body, a silicon carbide sintered body, or a sialon sintered body.

3. The ceramic circuit board according to claim 1, wherein an Al content of said Al—Si brazing material is 85 mass percent or more and the Si content of the Al—Si brazing material is in the range of 6 to 15 mass percent.

4. The ceramic circuit board according to claim 1, wherein said circuit layer has a thickness of 0.15 to 0.5 mm.

5. The ceramic circuit board according to claim 1, wherein said Al alloy film has a thickness of 0.1 to 0.5 µm.

6. The ceramic circuit board according to claim 1, having a void area ratio of no greater than 9%.

7. The ceramic circuit board according to claim 1, wherein said ceramic substrate has a thickness ranging from 0.625 to 1.2 mm.

8. A method for producing a ceramic circuit board comprising:
- integrally joining a circuit layer comprising a clad member that comprises an Al plate and an Al—Si brazing material to an Al alloy film, wherein said circuit layer comprising said clad member and a ceramic substrate having said Al alloy film thereon overlap with each other, and
- heating said circuit layer and said ceramic substrate at a temperature of 580° C. to 630° C. in an atmosphere of vacuum of $10^{-2}$ Pa or lower while applying a pressing load to the overlapped the clad member and the ceramic substrate so that the pressure of the load is 2 kg/cm$^2$ or more to join said circuit layer to said ceramic substrate, wherein said Al alloy film comprises at least one rare earth element selected from the group consisting of Y, Sc, La, Ce, Nd, Sm, Gd, Tb, Dy, Er, Th, and Sr in an amount of 1 to 5 atomic percent.

9. The method according to claim 8, wherein said ceramic substrate has a thickness ranging from 0.625 to 1.2 mm.

10. The method according to claim 8, wherein said ceramic substrate comprises an aluminum nitride sintered body, a silicon nitride sintered body, a silicon carbide sintered body, or a sialon sintered body.

11. A power module comprising:
- a ceramic circuit board prepared by a method that comprises integrally joining a circuit layer comprising a clad member that comprises an Al plate and an Al—Si brazing material to a ceramic substrate, wherein a surface of said clad member adjacent to said Al—Si brazing material is joined to said ceramic substrate with an Al alloy film therebetween, said Al alloy film having a thickness of less than 1 μm and provided on the surface of said ceramic substrate;
- a semiconductor element mounted on said circuit layer; and
- a heat sink that dissipates heat generated from said semiconductor element via said ceramic circuit board,
- wherein said Al alloy film comprises at least one rare earth element selected from the group consisting of Y, Sc, La, Ce, Nd, Sm, Gd, Tb, Dy, Er, Th, and Sr in an amount of 1 to 5 atomic percent.

12. The power module according to claim 11, wherein said ceramic substrate has a thickness ranging from 0.625 to 1.2 mm.

13. The power module according to claim 11, wherein said ceramic substrate comprises an aluminum nitride sintered body, a silicon nitride sintered body, a silicon carbide sintered body, or a sialon sintered body.

* * * * *